(12) United States Patent
Souchkov et al.

(10) Patent No.: US 7,034,563 B1
(45) Date of Patent: Apr. 25, 2006

(54) APPARATUS FOR MEASURING OF THIN DIELECTRIC LAYER PROPERTIES ON SEMICONDUCTOR WAFERS WITH CONTACT SELF ALIGNING ELECTRODES

(75) Inventors: Vitali Souchkov, Walnut Creek, CA (US); Vladimir Faifer, San Jose, CA (US); Victor Huang, San Jose, CA (US); Eugene Fukshansky, Mountain View, CA (US); Alexander Artjomov, Moscow Region (RU); Anatoli Skljarnov, Moscow (RU)

(73) Assignee: Ahbee 2, L.P., A California Limited Partnership, San Jose, CA (US)

( * ) Notice: Subject to any disclaimer, the term of this patent is extended or adjusted under 35 U.S.C. 154(b) by 0 days.

(21) Appl. No.: 11/044,771

(22) Filed: Jan. 26, 2005

(51) Int. Cl.
*G01R 31/26* (2006.01)

(52) U.S. Cl. .................................... 324/765
(58) Field of Classification Search ............... 324/766
See application file for complete search history.

(56) References Cited

U.S. PATENT DOCUMENTS

| | | | | |
|---|---|---|---|---|
| 3,493,858 | A | * | 2/1970 | Baron et al. ............... 324/72.5 |
| 3,990,005 | A | * | 11/1976 | Abbe et al. .................. 324/662 |
| 4,849,694 | A | * | 7/1989 | Coates ........................ 324/230 |
| 4,992,659 | A | * | 2/1991 | Abraham et al. ........... 250/306 |
| 5,266,889 | A | * | 11/1993 | Harwood et al. ........... 324/754 |
| 5,453,703 | A | * | 9/1995 | Goldfarb ...................... 324/765 |
| 5,500,607 | A | * | 3/1996 | Verkuil ....................... 324/761 |
| 5,642,056 | A | * | 6/1997 | Nakajima et al. ........... 324/758 |
| 6,407,546 | B1 | * | 6/2002 | Le et al. ...................... 324/230 |
| 6,563,308 | B1 | * | 5/2003 | Nagano et al. ............. 324/230 |
| 6,617,865 | B1 | * | 9/2003 | Di Stefano .................. 324/754 |
| 6,741,093 | B1 | * | 5/2004 | Howland et al. ........... 324/765 |
| 6,815,958 | B1 | * | 11/2004 | Kesil et al. .................. 324/662 |
| 2004/0155666 | A1 | * | 8/2004 | Kesil et al. .................. 324/662 |
| 2004/0196031 | A1 | * | 10/2004 | Nagano ....................... 324/230 |

\* cited by examiner

*Primary Examiner*—Vinh Nguyen
*Assistant Examiner*—Richard Isla-Rodas

(57) ABSTRACT

The invention relates to metrology of thin dielectric layers on semiconductor wafers, interfaces of dielectric layers to the wafer substrates and substrates properties of semiconductor wafers. The invention allows measurement of the metrology data for thin dielectric layers on semiconductor wafers electrically via using contact electrodes that align their contact surface to the wafer surface locally at the measurement sites.

7 Claims, 2 Drawing Sheets ial layer properties on semiconductor wafers with contact self aligning electrodes

BACKGROUND OF THE INVENTION

Detailed knowledge of thickness and electrical properties of thin oxide (dielectric) layers on semiconductor wafers and semiconductor substrate interfaces to these layers is crucial in predicting device parameters that could be fabricated using any given semiconductor technology. Characterization of dielectric layers and their interfaces to the substrates may be needed at different stages of production from blank wafers to product wafers. The greatest challenges for the measurements of dielectric layers properties represent product wafers where limited test areas sizes, exact locations of test sites and extraordinary precautions in handling and protecting the wafers are imperative.

The most successful solutions for the measurement of the above dielectric layer properties known in the art are offered by contact methods with one electrical means applied to the bottom surface of the wafer and another electrical means applied to the measurement site over the top of the wafer. To obtain well-defined contact area of the conductive probe that is applied on the top of dielectric layer the elastic deformation of the probe tip may be used as described in References [1,2]. Another opportunity is offered by mercury probe described in Reference [3] where well-defined contact area can be obtained in repeated measurements with conductive strained liquid electrode. An apparatus to perform similar measurements that effectively uses plastic deformations of the probe tip is disclosed in Reference [4].

All of the techniques listed in References [1–4] may not suit well the challenges urged by the necessity to characterize thin dielectric layers on product wafers. Plastically deformable probes may not suit well to a limited size and exact positioning of the probe tip at the test site on product wafers. Mercury probe does not meet the requirements of non-contamination, while elastically deformable probe tips (References [1,2]) may introduce uninvited excessive pressure on dielectric and even destroy the dielectric layer that reaches several tens of Angstrom thickness for modern technologies.

The invention described below allows achieving a highly repeatable contact area for the above measurements via aligning the contact electrode to the wafer surface locally at the measurement site with substantially reduced pressure on the surface of the dielectric compared with the contact measurement techniques known in the art.

SUMMARY OF THE INVENTION

An apparatus and a method to measure properties of dielectric layers on semiconductor wafers via providing electric contact to the wafer with an electrode that aligns its surface with the wafer surface at each measurement site are described. The core of the invented apparatus is the probe that comprises an electrode in the form of a conductive needle with a conic tip shape terminated by the flattened surface that has a circular outline. The needle is thread into a non-conductive thin disk, made of high quality dielectric, substantially perpendicular to the disk surface. The disk with the needle inserted is mounted into a holder that is a thin wall cylinder made of highly elastic material with interleaved openings on the cylinder wall. The above three parts, i.e. the needle the disk and the holder form the probe. The needle is connected to electric stimuli via a tiny and almost weightless wire. The construction of the probe allows an alignment of the probe tip surface to the wafer surface locally, upon bringing the probe to the wafer at a targeted location. This alignment is independent of a typical local nano-topography of the wafer (geometric variations of the wafer surface) provided the flat tip surface is small enough and the needle axis is substantially perpendicular to the wafer plane at initial conditions, before the needle touches the wafer. When the probe and the wafer are brought together, the continued motion of the wafer towards the probe causes deformation of the holder that is fixed at a steady position in space with a clamping device. The deformation of the holder allows an alignment of the needle tip flat surface to the wafer surface locally at the measurement site. With the tip surface roughness being extremely small the contact area of the tip is becoming almost independent of an external force applied to the holder at some small deformations of the holder. Hence the mechanism of the probe tip self alignment to the wafer surface is essential in obtaining highly repeatable contact area of the probe tip to the wafer surface with the contact pressure much smaller than for the measurement techniques known in the art.

With one electrical means applied to the conductive chuck that firmly supports the wafer and another electrical means applied to the probe tip deposited on the dielectric layer of the wafer the capacitance-voltage (C-V), conductance-voltage (G-V), conductance-frequency (G-F) and current-voltage (I-V) types of electrical stimuli are applied to the wafer at any probe tip location. The measured stimuli reactions allow characterization of dielectric layers on semiconductor wafers and semiconductor substrate interfaces to the dielectric layers while keeping the measurements conditions stable and repeatable at any location on the wafer.

DETAILED DESCRIPTION OF THE INVENTION

Figure 1:
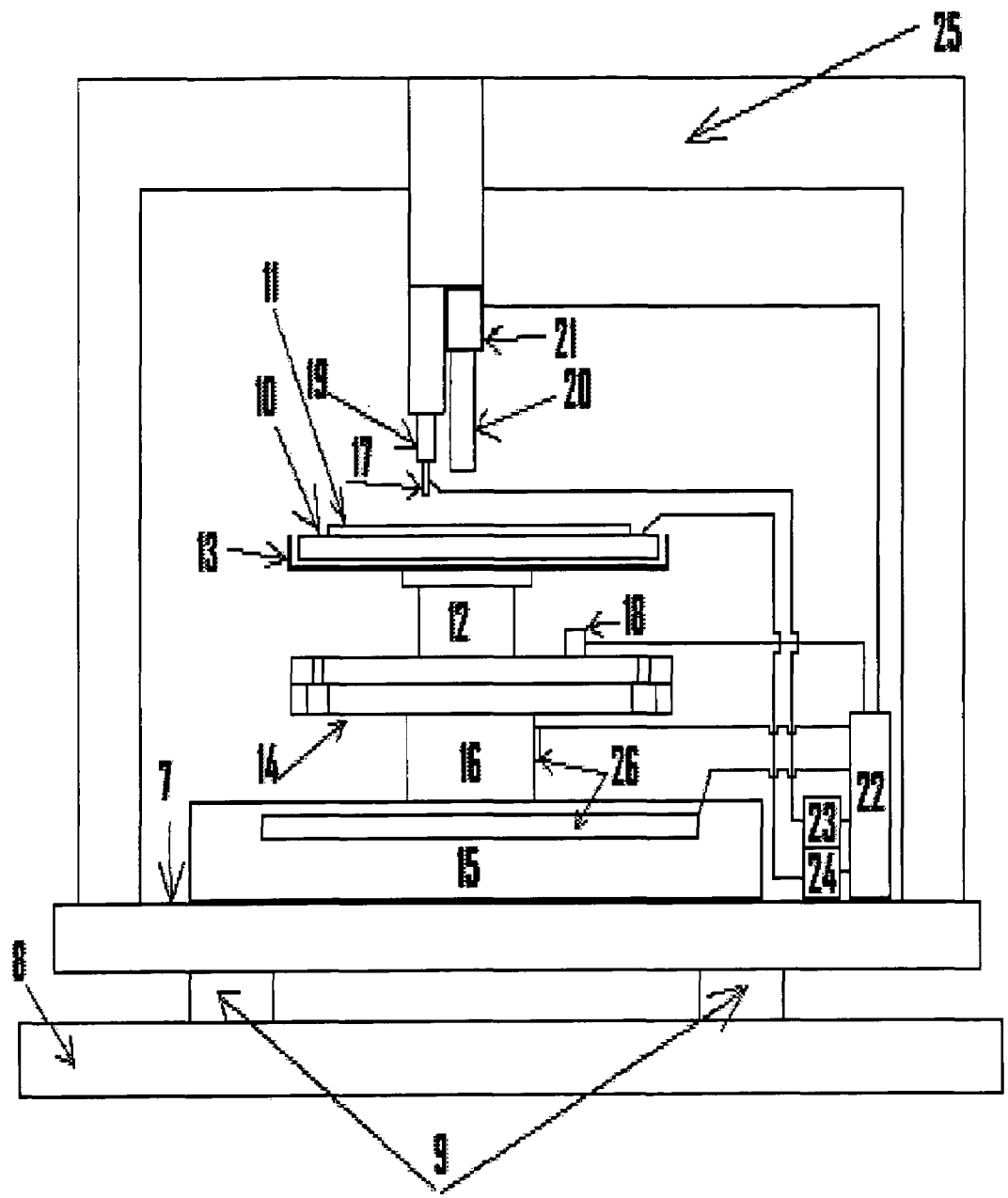
FIG. 1 depicts a side view of the invented apparatus for measurement of dielectric layers electric properties and thickness of dielectric layers on semiconductor product wafers as well as the wafers substrate properties.

A side view of the invented apparatus comprising the invented probe 17 is depicted in FIG. 1. A massive bridge 25 is mounted on a platform 7 that is isolated from the vibrations of the supporting frame 8 via active vibration isolation units 9 known in the art. The conductive vacuum chuck 10, known in the art, with a semiconductor finish over the surface where the wafer 11 is placed, is movable along the Z-axis (vertically up and down) by an actuator 12. The deviations of the chuck surface from an ideal plane are ±5 micrometer. The chuck is contained inside an electromagnetic shield 13. The actuator 12 for the chuck 10 is mounted on an adaptor plate 14 that allows adjustment of the chuck surface to horizontal. The quality of the chuck alignment and inspection of chuck surface variations is accomplished via measuring reflections of light from the chuck surface with optical equipment mounted to the massive bridge 25. The adaptor plate 14 is mounted at the top of X (15) and Y (16) crossed moving stages. The X-Y (horizontal) motion of the vacuum chuck 10, with the wafer 11 on it, allows bringing the probe 17, steadily clamped into the fixture 19 that is attached to the massive bridge 25 to any location in X-Y over the wafer. The position information of the vacuum chuck 10 during large vertical travel distances is obtained via measuring of the light reflected by the shield 13 that surrounds the bottom plane of the chuck with a diffused light reflection meter 18. The reflection meter 18 readings are read out to the computer 22.

Figure 2:
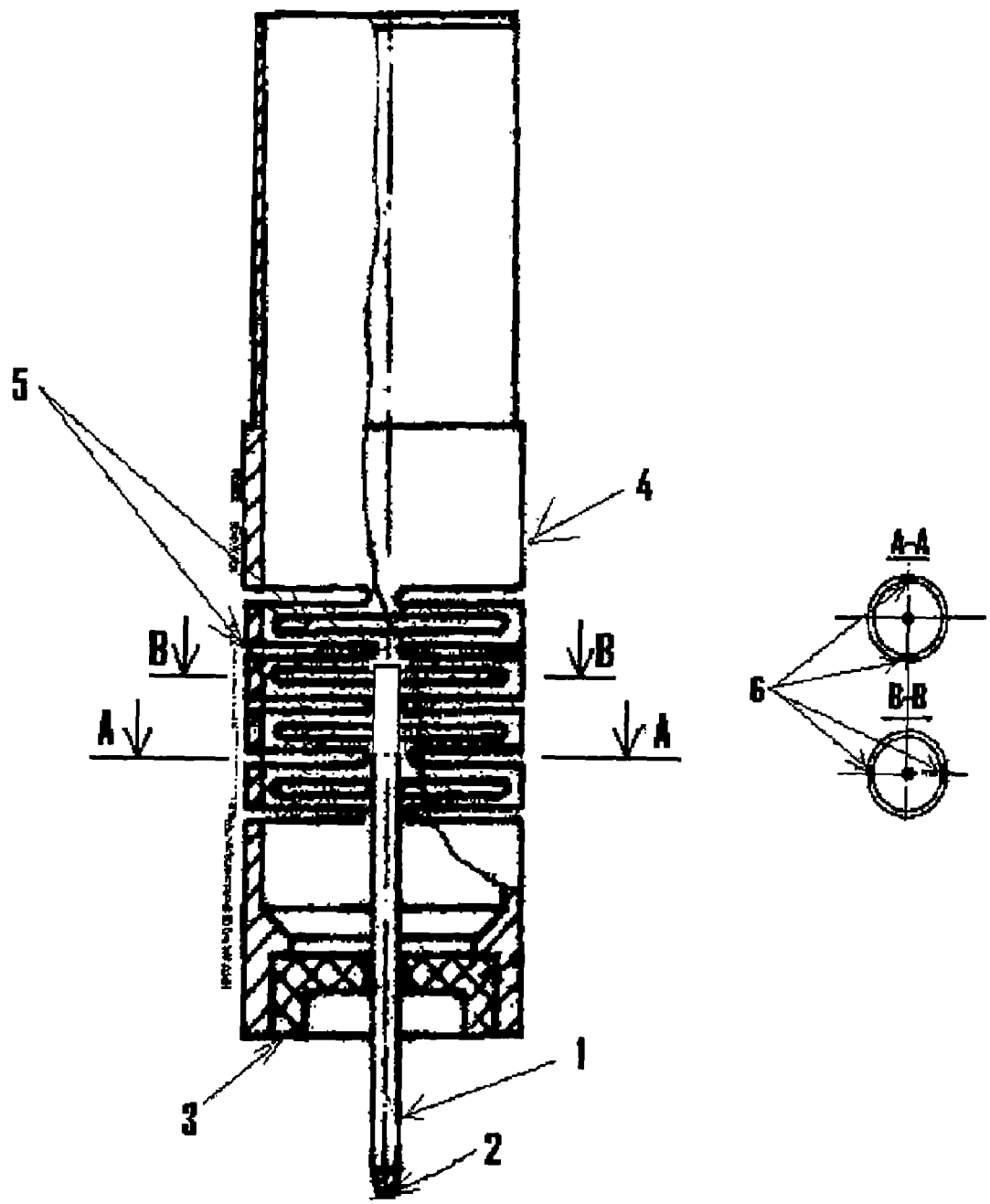
FIG. 2 depicts the invented probe with the contact surface that aligns to the wafer surface upon bringing together the probe and the wafer.

The invented probe 17 is depicted in detail in FIG. 2. The electrode of the probe is a conductive needle 1 with a conic tip shape terminated by the flattened surface 2 that has a circular outline. The needle 1 is inserted into a rigid disk 3, made of high quality dielectric, substantially perpendicular to the disk surface with deviations from an ideal perpendicular that are less than ±200 micro-Radian. The disk 3 with the needle 1 inserted into it is mounted into a holder 4 that is a thin wall cylinder made of highly elastic material with interleaved openings 5 on the cylinder wall. The conductive material of the needle 1 is a highly chemically stable molybdenum alloy. Typical diameter of the needle is 600 micrometers thus bending of the needle 1 is negligible when the probe tip touches the wafer as well as during maintaining the contact. The needle is sharpened at the end that faces the wafer at an angle about 45° with respect to its own axis to a diameter that is less than 100 micrometers (70 micrometers typical). The tip of the needle 1 is polished to achieve the flat surface 2 roughness that is within ten of Angstroms. The rounding of the edges of the flat surface 2 has a radius that is about one tenth of the tip surface outline radius. The length of the needle 1 that faces the wafer measured from the disk surface is about 3 mm. The needle 1 and the disk 3 form one almost non-deformable body. The necks 6 left on each row of the openings 5 in the holder 4 are rotated at 90° for the sequential row of openings in the simple holder as it is shown in cross-sections views A—A and B—B of FIG. 2. The rotation angle varies by a fraction of 90° in a more sophisticated holder construction. The arrangement of the openings in sequential rows allows the elastic deformations that the holder 4 undergoes when the needle tip surface 2 touches the wafer 11 to be transformed into rotation of the needle 1 in the plane perpendicular to the wafer. The above rotation allows reaching a highly conformal contact of the flat tip surface 2 with the wafer surface, when the wafer 11 continues to move in the direction of the probe 17 after touching the needle 1. The nano-topography data of wafers with dielectric (oxide) top layers shows that the vector of a local perpendicular to the surface of the dielectric may vary within ±150 micro-Radian. Substantial variations of the angle occur at distances much larger than the probe tip diameter that is typically less than 100 micrometers for the measurements on product wafers. The invented probe allows an accommodation of the probe tip surface to the local topography of the wafer surface with resultant repeatability of capacitance measurements about 0.5% for most dielectrics. The flexibility of the holder that is necessary for the above accommodation is reached via adjustment of the holder mechanical parameters, i.e. the size of openings 5, their number, the rotation angle for the openings in sequential rows, the holder cylinder walls thickness and the holder cylinder diameter. The invented probe allows high repeatability of measurements with the pressure on the dielectric layer that is substantially less than 1000 psi (pounds per square inch).

The probe fixture 19 and a microscope 20 with a CCD camera 21 attached to it form one rigid body. Therefore the X-Y position of the probe tip with respect to the microscope axis is established and stays unchanged during measurements, assured by the stability of the mechanical parts. The reference marks on the wafer under test are registered via CCD camera 21 and recognized by a programmable pattern recognition system upon transferring imaging information to the computer 22. The position measurement linear encoders 26 attached to the X and Y moving stages are used to place the probe 17 at locations on the wafer 11 targeted for the measurements using information on reference marks locations on the wafer. The information from linear encoders 26 is read out to the computer 22. Bringing the wafer in touch with the probe is controlled via measuring electric capacitance between the probe tip and the wafer continuously using measurement equipment 23, while the wafer approaches the probe. Before the wafer and the probe are in touch, the electric capacitance is determined by geometric surrounding of the probe. The electric capacitance and its variation are small when the wafer approaches the probe until the probe tip is only few micrometers away from the wafer. The electric capacitance rises several times when the probe tip touches the wafer no matter of what type of the wafer is under test. The Z coordinate of the touch is detected with resolution of one micrometer. After detection of the coordinate of the touch, the wafer 11 is pushed further in direction towards the probe 17 at a slow speed. The push-in asserts the probe tip alignment over the wafer surface locally at the test site, hence establishing measurement conditions that are proven to be stable in time and repeatable in numerous measurements. The distance of the push-in is determined by calibrated elastic properties of the probe holder 4.

In the invented apparatus the measurements of metrology data of thin dielectric layers on product wafers is based on applying electric stimuli to the conductive vacuum chuck 10 that supports the wafer under test from stimuli generators 24 known in the art and measurement of stimuli reactions with the measurement equipment 23 known in the art that is cabled to the probe 17. The connection of the stimuli generators 24 and the stimuli reaction receptacles (measurement equipment 23) may be swapped. The stimuli generators 24 and measurement equipment 23 are controlled via code executed by computer 22 cabled to them.

To derive metrology information from capacitance-voltage (C-V), conductance-voltage (G-V), conductance-frequency (G-F) and current-voltage (I-V) types of measurements, the contact area of the probe tip to the wafer has to be determined. The contact area for each probe is determined from calibration measurements on the wafers with known dielectric oxide thickness using capacitance-voltage (C-V) and conductance-voltage (G-V) types of measurements.

When the probe 17 is clamped into the fixture 19, the stability of the X-Y position of the probe tip with respect to the microscope axis is assured by the stability of mechanical parts. However, the probe tip position in X-Y is not known with the accuracy required for the measurements on product wafers. The position of the probe tip in X-Y is measured with respect to the axis of the microscope by using a calibration substrate with conductive features on it that have known sizes and locations. The X-Y motion of the vacuum chuck, with the calibration substrate attached to it is controlled using linear encoders 26. The horizontal chuck motion allows placement of the probe tip at different locations over the calibration substrate. When the calibration substrate touches the probe, the electric capacitance is measured at each location where the probe and the calibration substrate are brought in touch. The measured capacitance varies due to the presence of conductive features on the top surface of the calibration substrate. Therefore, the electric capacitance measurements on the calibration substrate allow X-Y measurement of the probe tip position with respect to the axis of the microscope with the accuracy necessary for the probe positioning on product wafers.

REFERENCES

1. U.S. Pat. No. 5,023,561, Apparatus and method for non-invasive measurement of electrical properties of a dielectric layer in a semiconductor wafer, Robert J. Hillard, Solid State Measurements Inc., Jun. 11, 1991.
2. U.S. Pat. No. 6,492,827, Non-invasive electrical measurements of semiconductor wafers, Robert G. Mazur, Robert J. Hillard, Solid State Measurements Inc., Dec. 10, 2002.
3. Vacuum operated mercury probe for CV plotting and profiling, A. Lederman, Solid State Technology, August 1981, pp. 123–126.
4. U.S. Pat. No. 5,500,607, Probe-oxide-semiconductor method and apparatus for measuring oxide charge on a semiconductor wafer, Inventor Roger L. Verkuil, International Business Machines Corporation, Mar. 19, 1996.

We claim:

1. An apparatus for measurement of dielectric layer properties and thickness of dielectric layers on semiconductor product wafers as well as wafer substrate properties comprising:
    a means for providing electrical contact to a dielectric layer of the wafer comprising a conductive probe further comprising a shaped conductive needle with polished flat ending installed into self alignment means for establishing conformal contact between the needle flat ending and the dielectric layer, wherein the self alignment means comprises a nonconductive disk with the needle inserted into it substantially perpendicular to the disk surface, the disk with the needle is mounted into a holder that is made in form of a thin wall cylinder made of highly elastic and chemically stable material with interleaved openings on the cylinder wall where the openings are in sequential rows disposed along the cylinder axis and rotated at 90° or at a smaller angle,
    a fixture for the self alignment means that is mounted on a massive bridge,
    a conductive vacuum chuck for supporting a wafer and for providing electrical contact to the wafer back side,
    a mechanism for supporting the conductive vacuum chuck,
    means for stimulating electric current flow through the dielectric layer, and
    means for determining electrical properties of the dielectric layer, in which both means are electrically connected with the conductive probe and the vacuum chuck.

2. The apparatus as described in claim 1, wherein the mechanism for supporting of the conductive vacuum chuck comprises a platform isolated from vibrations of a supporting frame by vibration isolation units further comprising an actuator that provides the conductive vacuum chuck vertical motion with the actuator fixed to an adaptor plate which has an adjustable horizon that is mounted on crossed actuators that provide the horizontal motion of the chuck, further comprising an electromagnetic shield that surrounds the conductive chuck from the bottom and an optical reflected light meter mounted to the adaptor plate.

3. The apparatus as described in claim 1 further comprising a microscope with a CCD camera attached to it, mounted to a massive bridge disposed on the platform.

4. A method of measuring dielectric layer properties and thickness of dielectric layers on semiconductor product wafers comprising:
    accurately positioning a probe above a test site of a product wafer using a microscope with a CCD camera attached to it,
    movement of the wafer towards the probe with detection of a vertical coordinate of the moment when a tip of the probe touches the dielectric surface of the wafer via measuring an electric capacitance between the probe tip and the wafer,
    a calibrated push-in of the wafer towards the probe that results in elastic deformation of a holder of the probe further comprising a conformal alignment of the probe tip to the dielectric layer surface of the wafer locally at the measurement site independently of local variations of the wafer surface,
    measurement of the reaction on capacitance-voltage (C-V), conductance-voltage (G-V), conductance-frequency (G-F) and current-voltage (I-V) types of electrical stimuli applied to the wafer, and
    determination of the dielectric layer, dielectric interface and substrate properties from the measurements.

5. The method as described in claim 4 further comprising a minimal pressure of the probe tip to a thin dielectric layer at the test site for the measurements.

6. The method as described in claim 4 further comprising an accurate positioning of the probe at the test site of a product wafer by using information of the probe tip coordinates in a horizontal plane with respect to the microscope axis.

7. The method as described in claim 6 further comprising measurement of the probe tip coordinates with respect to the microscope axis via bringing the probe tip in touch with a calibration substrate that has conductive features with known sizes and locations and measuring electric capacitance between the probe tip landed on the calibration substrate and the bottom of the calibration substrate further comprising calibrated horizontal motion of the calibration substrate and landing of the probe tip at different locations on the calibration substrate with derivation of the probe tip coordinate with respect to the axis of the microscope by comparing imaging data observed via the microscope with electric capacitance measurements at each landing.

* * * * *